(12) United States Patent
Anderson

(10) Patent No.: US 6,243,614 B1
(45) Date of Patent: Jun. 5, 2001

(54) METHOD AND PRODUCT FOR OPTIMIZING ASSEMBLY PERFORMANCE

(75) Inventor: David S. Anderson, Belle Plaine, KS (US)

(73) Assignee: The Boeing Company

(*) Notice: Subject to any disclaimer, the term of this patent is extended or adjusted under 35 U.S.C. 154(b) by 0 days.

(21) Appl. No.: 09/119,898

(22) Filed: Jul. 21, 1998

(51) Int. Cl.$^7$ .................................................. G06F 19/00
(52) U.S. Cl. .......................... 700/108; 700/97; 700/103
(58) Field of Search .................................. 700/108, 109, 700/111, 103, 95, 98, 97; 709/223, 227, 250, 248, 224

(56) References Cited

U.S. PATENT DOCUMENTS

| | | | |
|---|---|---|---|
| 5,687,094 | * 11/1997 | Kagawa et al. | 364/512 |
| 5,808,432 | * 9/1998 | Inoue et al. | 318/561 |
| 5,825,651 | * 10/1998 | Cupta et al. | 700/103 |
| 5,907,489 | * 5/1999 | Elliott | 700/103 |
| 5,949,693 | * 9/1999 | Tandler | 364/512 |
| 6,061,722 | * 5/2000 | Lipa et al. | 709/224 |

* cited by examiner

*Primary Examiner*—Thomas Lee
*Assistant Examiner*—Mai Rijue
(74) *Attorney, Agent, or Firm*—Brooks & Kushman P.C.

(57) ABSTRACT

A computer based method optimizes the performance of a product with a plurality of characteristics such as measurements and associated tolerances, using a performance rating based on a performance factor and a contribution parameter set. A characteristic tree has nodes corresponding to characteristics. A design limit and a process capability are determined for each node. Each node has a contribution parameter set with each parameter representing the contribution of a contributor to variations in the characteristic corresponding to that node. An output is generated based on the performance rating and the characteristic tree, with the performance rating for each node based on the performance factor and the contribution parameter set for that node, to illustrate the connectivity among different performance areas for the product.

20 Claims, 12 Drawing Sheets

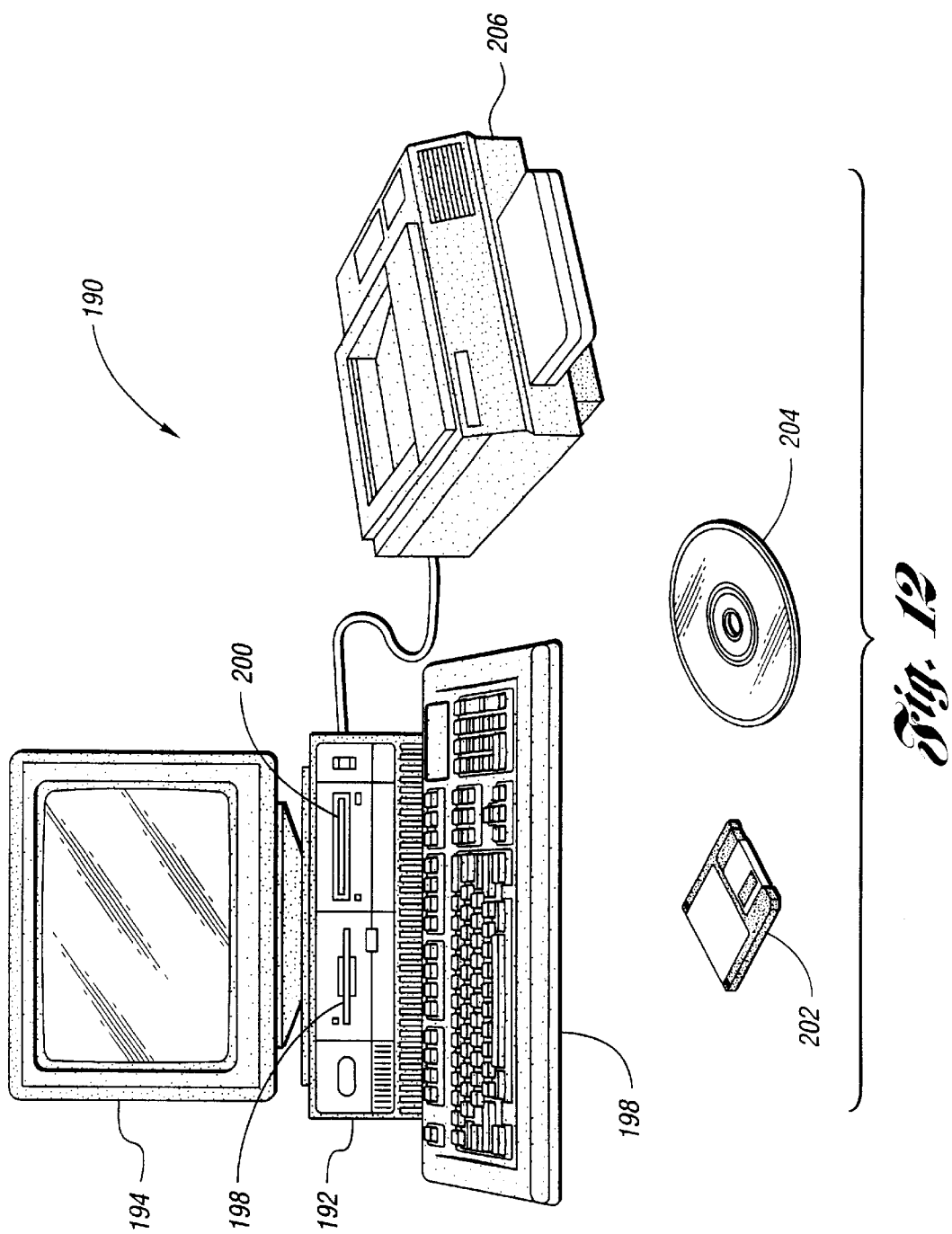

METHOD AND PRODUCT FOR OPTIMIZING ASSEMBLY PERFORMANCE

BACKGROUND OF THE INVENTION

1. Field of the Invention

The present invention relates to methods and products for optimizing assembly performance.

2. Background Information

Most manufactured products have many components defining many physical and operational characteristics such as, for example, measurements having tolerances. These characteristics include characteristics defined by a single component, and characteristics defined by cooperating components such as, for example, a gap measurement.

U.S. Pat. No. 5,586,052 issued to Iannuzzi et al. describes an existing rule based method for evaluating an engineering design. The methods described therein establish relationships between part features and part tolerances. These relationships are interpreted in light of a given set of completeness and well formedness criteria to determine part quality. If a part is unacceptable, a designer may then revise the tolerance plan.

Although existing hardware variability control techniques employed in the manufacturing of products have been used successfully in the past, these existing methods do not systematically identify critical product characteristics while illustrating the connectivity among different performance areas for the product such as fit, form and function. Thus, with existing methods there is little guidance available for choosing tolerances that will provide acceptable quality in the final assembly, while not applying excessively strict tolerances that increase cost.

SUMMARY OF THE INVENTION

In carrying out the above objects, other objects and features in the present invention, a computer based method for optimizing performance of a product having components defining a plurality of characteristics is provided. The method comprises constructing a characteristic tree with branches corresponding to performance areas. The characteristic tree has nodes corresponding to characteristics. A design limit is inputted for each node. Process capability for each node is determined based on the design limit for that node. A performance factor is determined for each node based on the process capability for that node.

The method further comprises inputting a contribution parameter for each node with each contribution parameter for each node representing the contribution of a contributor to the variation in the characteristic corresponding to that node. A performance rating is determined for each node with the performance rating based on the performance factor and the contribution parameter for that node. An output is generated based on the performance rating and the characteristic tree to illustrate the connectivity among the performance areas of the product.

Further, in carrying out the present invention, a product for optimizing performance of a device having components defining a plurality of characteristics is provided. The product comprises a storage medium, and computer readable instructions recorded on the storage medium. The instructions are operative to construct a characteristic tree, input a design limit, determine a process capability, determine a performance factor, and input a contribution parameter. The instructions are further operative to determine a performance rating, and generate an output based on the performance rating and the characteristic tree to illustrate the connectivity among the performance areas of the product.

The advantages associated with embodiments of the present invention are numerous. For example, embodiments of the present invention make it possible to systematically identify critical product characteristics, and illustrate to a user the connectivity among different performance areas for the product. In manufacturing, tolerances for an assembly may be optimized, to the extent desired, based on the quality requirements of the completed assembly and the capabilities of the manufacturing processes used. Further, products such as, for example, aerospace products, may be designed in accordance with methods and products of the present invention.

The above objects and other objects, features, and advantages of the present invention are readily apparent from the following detailed description of the invention when taken in connection with the accompanying drawings.

BRIEF DESCRIPTION OF THE DRAWINGS

FIG. 12 is a computer system for executing instructions on computer readable storage media in accordance with one embodiment of the present invention.

DETAILED DESCRIPTION OF THE INVENTION

In accordance with the present invention, a method, which is preferably a computer based method, for optimizing performance of a product having components defining a plurality of characteristics is provided. A characteristic tree has branches corresponding to performance areas and nodes corresponding to product characteristics. Each node contains a variety of information including at least one design limit, a process capability, at least one performance factor, a contribution parameter set having at least one contribution parameter, and a performance rating. The rating at each node is based on a performance factor and a contribution parameter for that node such that the performance rating illustrates a cause/effect relationship at that node classified by a contribution parameter. Methods of the present invention may be employed for making a variety of products, including aerospace components. Further, the present invention provides a computer readable storage medium having computer readable instructions recorded thereon that are operative to optimize performance.

Figure 1:
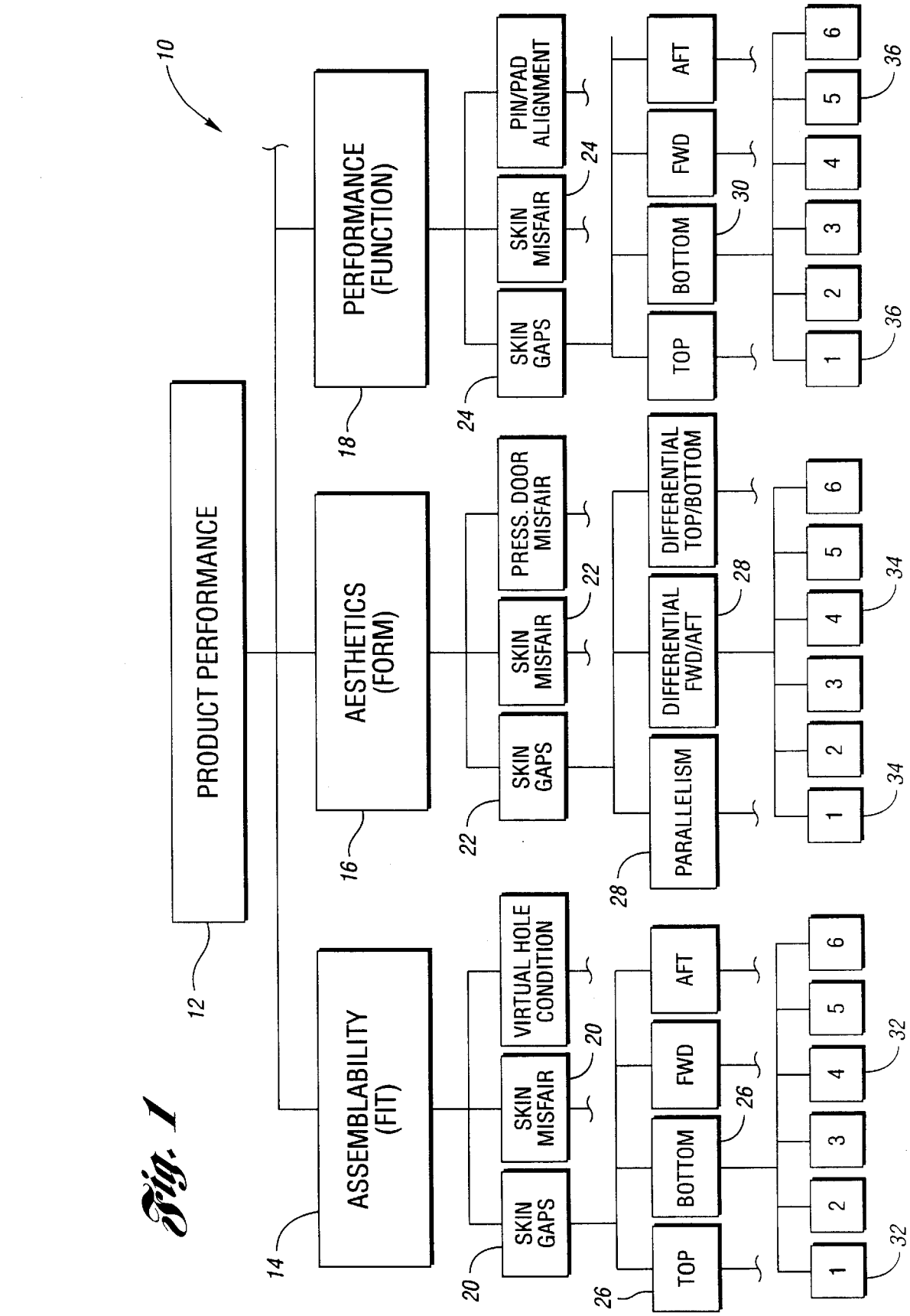
FIG. 1 is a measurement tree in accordance with one embodiment of the present invention illustrating overall product performance, families, groups, measurement nodes, and information blocks.

Referring to FIG. 1, a measurement tree for an aircraft door panel in accordance with one embodiment of the present invention is generally indicated at 10. As seen therein, a product performance block 12 branches into several quality families. In the exemplary measurement tree illustrated, assemblability (fit) block 14, aesthetics (form) block 16, and performance (function) block 18 are performance areas or quality families. Each quality family branches into several groups. The same group may occur in any number of different families. As shown, assemblability block 14 branches into group blocks 20. Aesthetics block 16 branches into group blocks 22. Performance block 18 branches into group blocks 24. The group blocks represent groups of measurements within a family. Group blocks 20, 22, 24 branch into measurement blocks 26, 28, 30, respectively. The measurement blocks represent measurements within a group. For example, a group called "skin gaps" in the assemblability and performance families may branch into top, bottom, forward, and aft measurement blocks. Of course, this same group may have different measurement blocks when the group is in a different family. For example, "skin gaps" in the aesthetics family may branch into parallelism, differential forward/aft, and differential top/bottom measurement blocks. Further, each measurement block 26, 28, 30 branches into information blocks 32, 34, 36, respectively.

Each measurement block is a node of measurement tree 10, while the families (and the groups) form branches of measurement tree 10. A shared measurement is a measurement that occurs at more than one node. Shared measurements may be shared by two or more groups and/or by two or more families. A measurement corresponding to more than one quality family is called a multi-family measurement. These shared measurements that occur at multiple nodes may have different contents in their respective information blocks. That is, the same measurement may have different design limits and/or quality limits at different nodes which may be in different groups and/or different families of measurement tree 10.

It is to be further appreciated that the family blocks, group blocks, measurement blocks, and information blocks shown are an illustrative example of measurement tree branching. Additional families, such as service life (longevity) and other families, may branch from product performance block 12 in addition to or as a substitute for the family blocks depicted in FIG. 1. More particularly, there is no limit to the number of different families, groups, measurements, or information blocks that may be employed in embodiments of the present invention. Information blocks 32, 34, 36 contain critical information about the corresponding measurement. For example, design limits, process capability, contribution parameters, and performance ratings may be contained in the information blocks. Further, other information may be contained in the information blocks. Measurement tree 10 is constructed such that adjusting values contained within an information block at any measurement block (node) in measurement tree 10 affects values in information blocks throughout measurement tree 10. More particularly, a designer may observe how the change of a single value in a single information block affects the overall product, and affects particular families, groups, measurements, or information blocks.

Measurement tree 10 allows a designer to determine which measurements impact which aspects of the product performance. This allows the designer to see which areas are showing deficient or superfluous performance. Any measurement or group of measurements may impact more than one aspect of the product performance. Skin gaps, for instance, may impact fit, form, and function while the virtual condition of fastener holes may only impact fit and service life. Furthermore, the design limits for a particular measurement may be different for each aspect of product performance. It is to be appreciated that measurement tree 10 and methods of the present invention allow a designer to see which aspects of a product are impacted by changes in any particular information block so that a designer can make more informed decisions. That is, if a product does not meet overall performance requirements, measurement tree 10 allows the designer to identify the critical product characteristics, and the groups and quality families of those characteristics. It is also to be appreciated that although measurement tree 10 shown in FIG. 1 is constructed to optimize spatial measurements in a product, embodiments of the present invention may be employed to optimize other product characteristics in addition to spatial measurements.

Certain terminology has been used herein to facilitate an understanding of the present invention. These terms are now defined, immediately below.

The word "characteristic" as used herein means any feature that experiences variation, and that may be described by a value or set of values. A spatial distance measurement is one example of a characteristic. Other examples of characteristics are dimensions, shape, orientation, material properties, and any other information about a product that may be described by a value or set of values.

The term "characteristic tree" as used herein means a structure with nodes corresponding to characteristics. Any number of nodes may correspond to the same characteristic. Each node possesses information indicating the corresponding characteristic, and the different families, and/or groups, etc., associated with that node. Of course, the characteristic tree need not be physically structured as a tree, but may take many equivalent forms such as an array wherein the element subscripts indicate node information.

The term "design limit" as used herein means a value or set of values capable of limiting a characteristic so that the characteristic is acceptable at a particular node of the measurement tree. Some examples of a design limit are distance measurement limits and angular measurement limits. Further, the use of upper and lower design limits is an illustrative embodiment of the present invention; other design limits are contemplated, such as multi-dimensional limits. For example, a vector may serve as n-dimensional design limit when the characteristic is described by an n-dimensional vector. Different distance measures may be employed to determine distances between a multi-dimensional characteristic and the associated multi-dimensional design limit, and to determine when the characteristic falls above, falls below, or falls within the design limit.

For example, the design limit for a particular measurement at a particular node may be an n-dimensional vector and all space within a certain acceptable region surrounding that vector. Part of the region outside of the acceptable region may be defined as below the design limit, with the remaining region outside of the acceptable region defined as above the design limit. Characteristics having description vectors within the acceptable region may be considered to meet the design limit. Of course, the same characteristic frequently has different design limits at different nodes of the measurement tree.

The term "process capability" as used herein means a value or set of values that reflects the ability of the process to produce a characteristic meeting a design limits. For example, process capability may be measured by a statistical value based on a mean and a spread for the characteristic, such as Cpk. Of course, Cpk is merely one example of process capability, and others are contemplated.

The term "quality limit" as used herein means a value or set of values capable of limiting process capability so that process capability is acceptable. For example, if process capability is indicated by a single value, then the quality limit may be an upper limit value and a lower limit value that define an acceptable range for process capability. Because each node has its own process capability, each node may have different quality limits.

The term "performance factor" as used herein means a value or set of values based on the process capability. More particularly, a performance factor may exaggerate changes in process capability to emphasize degradation in performance when process capability falls below the quality limit, or to emphasize excessive expenditures when process capability falls above the quality limit. Certain exemplary performance factors that are used in preferred implementations of the present invention are described immediately below. It is to be appreciated that other performance factors may be used in addition to or as substitutes for those described below. Further, although preferred embodiments of the present invention utilize performance factors, it is possible to determine performance ratings (defined below) directly from the process capability and the quality limit.

The term "quality factor" as used herein means a performance factor that is defined so as to fall in a fixed range when the node process capability meets the corresponding quality limits. The quality factor may fall outside of the fixed range when the corresponding quality limit is not met by the node process capability. Thus, different nodes having different quality limits may be readily compared by examining the quality factor for each node.

The term "Pain Factor" as used herein means a performance factor that represents the degree of unacceptability of a product when the node process capability falls below the corresponding quality limit. That is, the Pain Factor generally increases as a distance between the node process capability and the corresponding quality limit increases, when the process capability falls below the corresponding quality limit. The Pain Factor may have a different trend when the process capability meets or falls above the corresponding quality limit, such as always equal to zero.

The term "Expense Factor" as used herein means a performance factor that represents the excess expense in a product when the node process capability falls above the corresponding quality limit. That is, the Expense Factor generally increases as a distance between the node process capability and the corresponding quality limit increases, when the process capability falls above the corresponding quality limit. The Expense Factor may have other values when the process capability meets or falls below the corresponding quality limit, such as always equal to zero.

The term "Key Factor" as used herein means a performance factor that represents the potential of a node to detrimentally impact overall product performance. That is, the Key Factor for a node generally increases as a distance between the node process capability and an upper limit of the quality limit increases, when the process capability falls below the upper limit. That is, Key Factor begins to generally increase as soon as process capability is no longer above the quality limit, as opposed to Pain Factor which begins to generally increase when process capability falls below the quality limit.

The term "contributor" as used herein means anything that causes variation in characteristics. That is, a particular product will have a plurality of contributors that affect the product characteristics. Moreover, variations in some characteristics are contributors to variations in other characteristics. For example, tolerance build up illustrates how variations in measurements may affect each other, when some of the characteristics are measurements.

The term "contribution parameter" as used herein means a parameter for a particular node that represents the contribution of a corresponding contributor to the variation in the characteristic corresponding to that node. More particularly, each node of a characteristic tree has a set of contribution parameters. Each parameter of the set is indicative of the effects of a particular contributor on that node's corresponding characteristic. For example, in tolerance build up at node X1, PARAMETER_XA, PARAMETER_XB, and PARAMETER_XC, may indicate the percent contributions of tolerance A, tolerance B, and tolerance C, to the build up of tolerance X which corresponds to node X1. Node X2 may have the same contribution parameters as node X1 because both nodes correspond to tolerance X; however, the other information at node X1 and node X2 may differ due to different design limits and/or different quality limits at the two nodes.

The term "performance rating" as used herein means a value that is based on a performance factor and a contribution parameter. More particularly, a performance rating for a node indicates the effect of a particular contributor on a performance factor of that node. For example, performance ratings PAIN_X1A, EXPENSE_X1A, and KEY_X1A may indicate amounts of pain, expense, and key, respectively, contributed by tolerance A to the total pain, expense, and key, respectively, of tolerance X at node X1. (Tolerance X may contribute differently at other nodes corresponding to tolerance X due to different contribution parameters at those other nodes.) For example, PAIN_X1A may be found by multiplying the total pain at node X1 by PARAMETER_XA; and, EXPENSE_XA and KEY_XA may be found by multiplying the total expense and key, respectively, at node X1 by PARAMETER_XB and PARAMETER_XC, respectively.

Of course, although a performance rating is preferably based on a performance factor and a contribution parameter, a performance rating may alternatively be determined directly from process capability and a contribution parameter, if desired. That is, performance ratings are always based on process capability because performance factors are based on process capability.

Further, it is to be appreciated that n-dimensional vectors and complicated distance measures may be utilized for any of the terms described above as being a value or set of values. Thus, the n-dimensional vector example described previously as an example of design limits may be implemented for quality limits and/or other items, as well.

In the following description of a preferred embodiment of the present invention, wherein reference is made to FIGS. 1–10, the product characteristics at the nodes 26, 28, 30 (FIG. 1) of the measurement tree 10 (FIG. 1) are physical distance measurements. Of course, physical distance measurements are merely one example of a characteristic that may be optimized in accordance with the present invention, and it is to be appreciated that the terminology used in the below description is used for convenience in reference only for the embodiment illustrated, and that those terms are not meant to limit the definitions given above, or to limit any definitions given below.

Further, the term "optimizing" as used herein when discussing the optimization of performance means optimizing to the extent desired by the designer. That is, the term optimizing does not specifically mean finding absolute minima or maxima for certain performance ratings, but instead means to allow a designer to observe the connectivity of different performance areas and make informed decisions when designing a product. Further, the present invention may also be used with computer-assisted optimizing, or computer optimizing, in addition to manual manipulation of the characteristic tree by the designer.

Figure 2A:
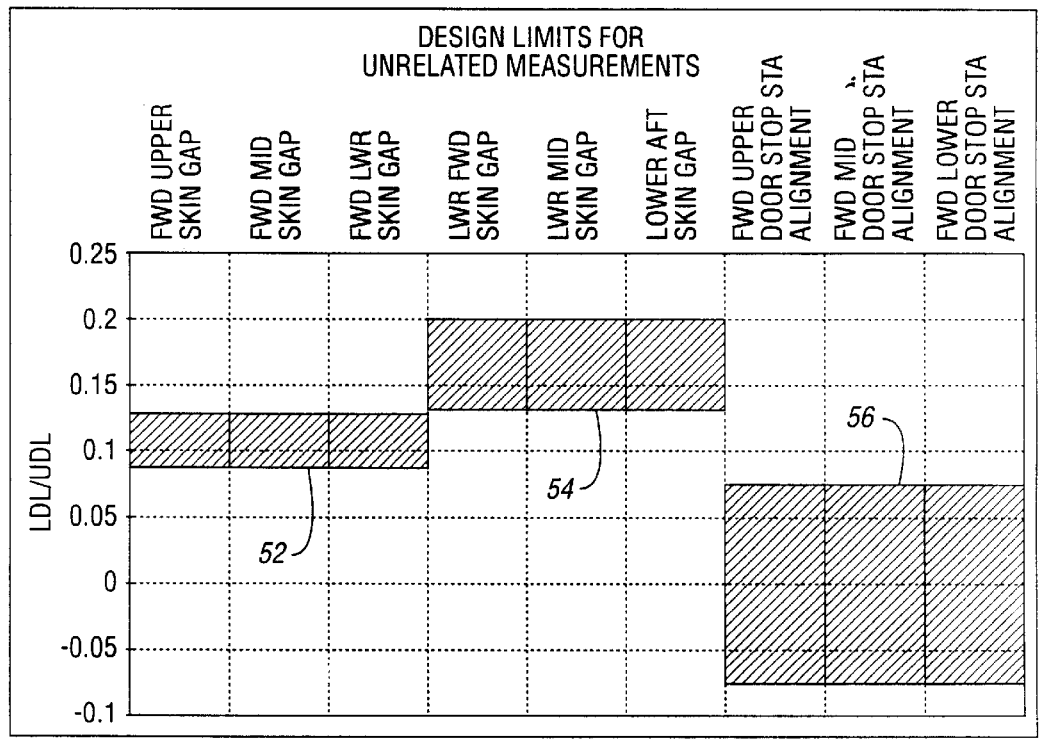
FIG. 2A is a chart depicting upper and lower design limits according to one embodiment of the present invention.

With reference to FIG. 2A, a chart depicting upper and lower design limits for different nodes is generally indicated at 50. Meaningful design limits are required for this analysis technique to function properly. It is common to find multiple sets of reasons for setting design limits at different values for a particular measurement or other characteristic. The practice of simply setting design limits at the most conservative limits must be avoided. Measurement tree 10 should be provided with adequate capability to record the complete design intention. Separate sets of design requirements must be defined at appropriate nodes in the measurement tree. For example, a measurement may require performance within +/−0.25 inches to function properly, as in the gaps around a car door. However, the customer would object to any variation that exceeded parallelism of the two sides of the gaps of +/−0.060. The designer would inherently set the design limit at +/−0.060 without regard that the width may simply need to be refined with a parallelism requirement.

In accordance with the present invention, the measurement tree would have two different nodes for such a gap. The first node may have design limits of +/−0.25 inches. The second node may define a parallelism requirement. In this manner, embodiments of the present invention allow a designer to see how changes in any part of the design affect the ability of the product to meet the gap requirements at the first node, and the ability of the product to meet the parallelism requirement at the second node.

The upper and lower design limits at a node define a range that is acceptable for the corresponding measurement at that node. Thus, the same measurement may occur at a number of nodes, with different upper and lower design limits at each node. In chart 50, upper/lower design limits are indicated along the ordinate, while each division along the abscissa corresponds to a different node on measurement tree 10 (FIG. 1). Acceptable ranges for exemplary nodes are indicated at 52, 54, 56.

Because the same measurement may occur at different nodes of measurement tree 10 (FIG. 1) with different design limits at each node, the product model may indicate that the same measurement is inadequate at some nodes of the measurement tree because of the design limits at those nodes, while indicating that the measurement is acceptable at other nodes because of the design limits at those other nodes.

As shown in FIG. 2A, design limits are generally quite variable in their origins and sizes. Design limits can not always be compared directly to each other because there is no indication of what acceptable process capability would be for each node of the measurement tree. Thus, in accordance with the present invention, upper and lower quality limits are preferably established for each node.

Figure 2B:
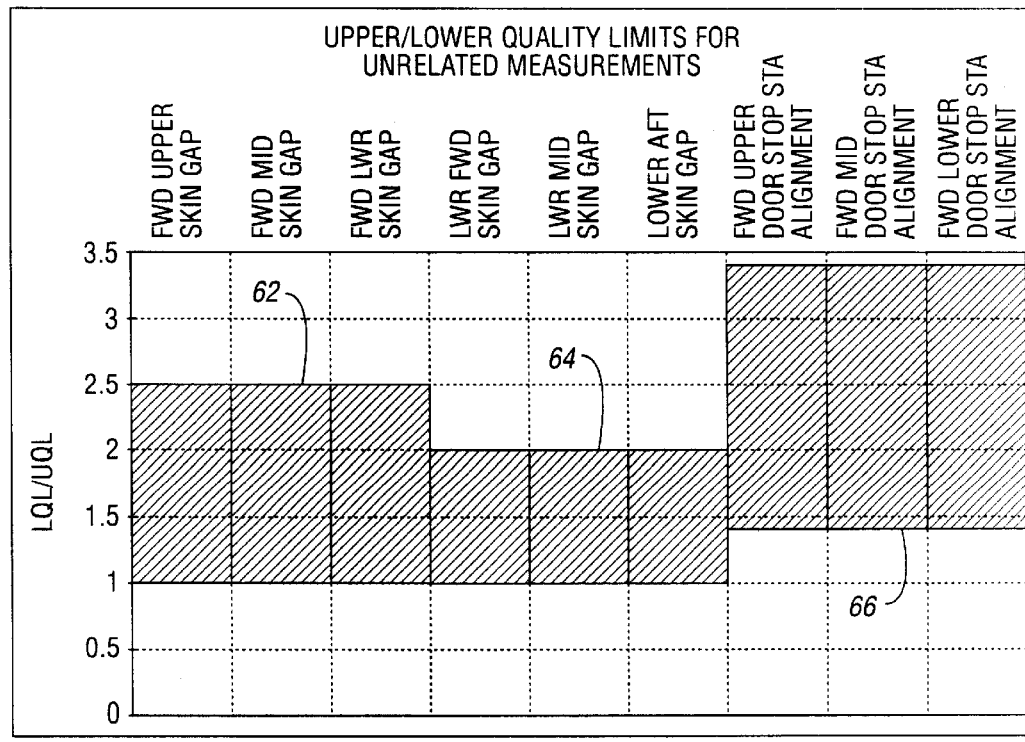
FIG. 2B is a chart depicting upper and lower quality limits according to one embodiment of the present invention.

With reference to FIG. 2B, a chart depicting upper and lower quality limits for different nodes is generally indicated at 60. The upper and lower quality limits define acceptable ranges for the process capability associated with a given node. That is, if the process capability for a node is within the quality limits for that node, the product will have the desired quality. If the process capability is below the lower quality limits, product quality begins to degrade. If the process capability is above the upper quality limit, product expenditures begin to unnecessarily increase. More particularly, the lower quality limit defines when the quality of the product will not allow it to perform or appear as desired by the designer; and, the upper quality limit defines the upper limit beyond which the company does not wish to expend additional budget to affect improvements which will not improve customer satisfaction or value. More particularly, each characteristic corresponds to one or more nodes in the measurement tree, with each node possessing design limits and quality limits.

Preferably, process capability is determined in a manner such that acceptable process capability values are greater than zero. This allows easier comparison and evaluation of multiple, possibly unrelated properties of a product. Exemplary, acceptable ranges for process capability, i.e. quality ranges, are depicted at 62, 64, 68 in FIG. 2B. In a preferred embodiment, process capability for each node is a statistical value based on a mean and a spread of the corresponding characteristic value (or set of values), and more preferably is the Cpk for the node.

It is to be appreciated that embodiments of the present invention may be implemented in a manner such that narrow quality ranges indicate that a property is inherently expensive to produce to higher quality performances.

Figure 3:
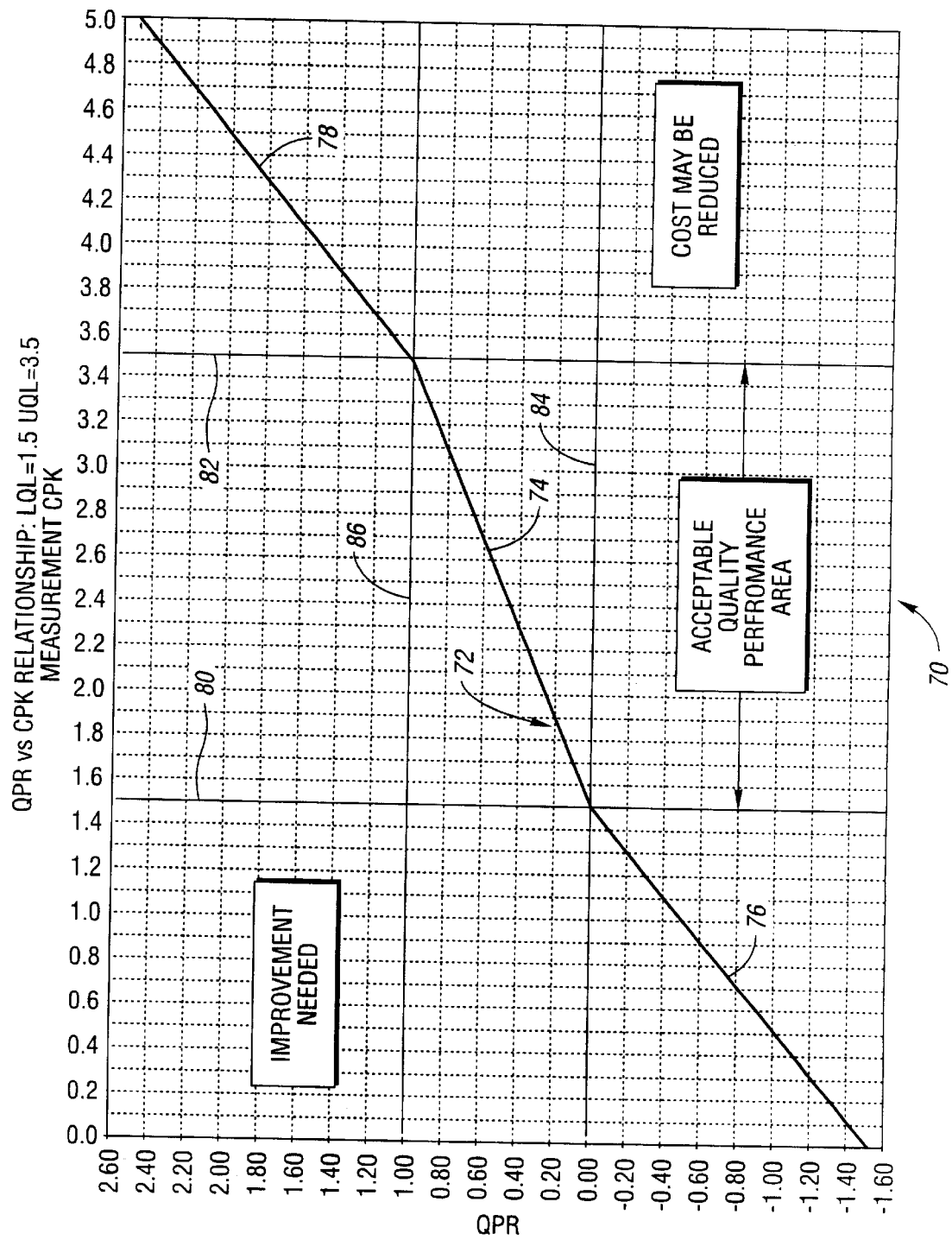
FIG. 3 is a graph depicting Quality Performance Rating versus process capability measured as the Cpk at the measurement node according to one embodiment of the present invention.

Referring to FIG. 3, a graph depicting Quality Performance Rating versus process capability measured as the Cpk at the measurement node is generally indicated at 70. The quality performance factor indicated along line 72 is one example of a "quality factor" in accordance with the present invention. Line 72 has a central portion 74, a left side 76, and a right side 78. The lower and upper quality limits are indicated by lines 80 and 82, respectively. The upper and lower quality limits define an interval in which process capability meets the quality limits as defined by the quality limits. Central portion 74 of Quality Performance Rating line 72 falls in a fixed range defined by lower and upper bounds 84 and 86, respectively. Left portion 76 and right portion 78 of Quality Performance Rating line 72 have increased slope relative to central portion 74 to reflect more dramatic changes in performance when the Quality Performance Rating is outside of the quality limits.

Quality factors are useful in that a quality factor such as the Quality Performance Rating maps acceptable process capabilities to a fixed range so that unrelated product properties may readily be compared to each other during product analysis. In graph 70, a Quality Performance Rating less than zero indicates that improvement is desired, a number between zero and one is acceptable, and a number greater than one means that costs may be reduced.

Figure 4:
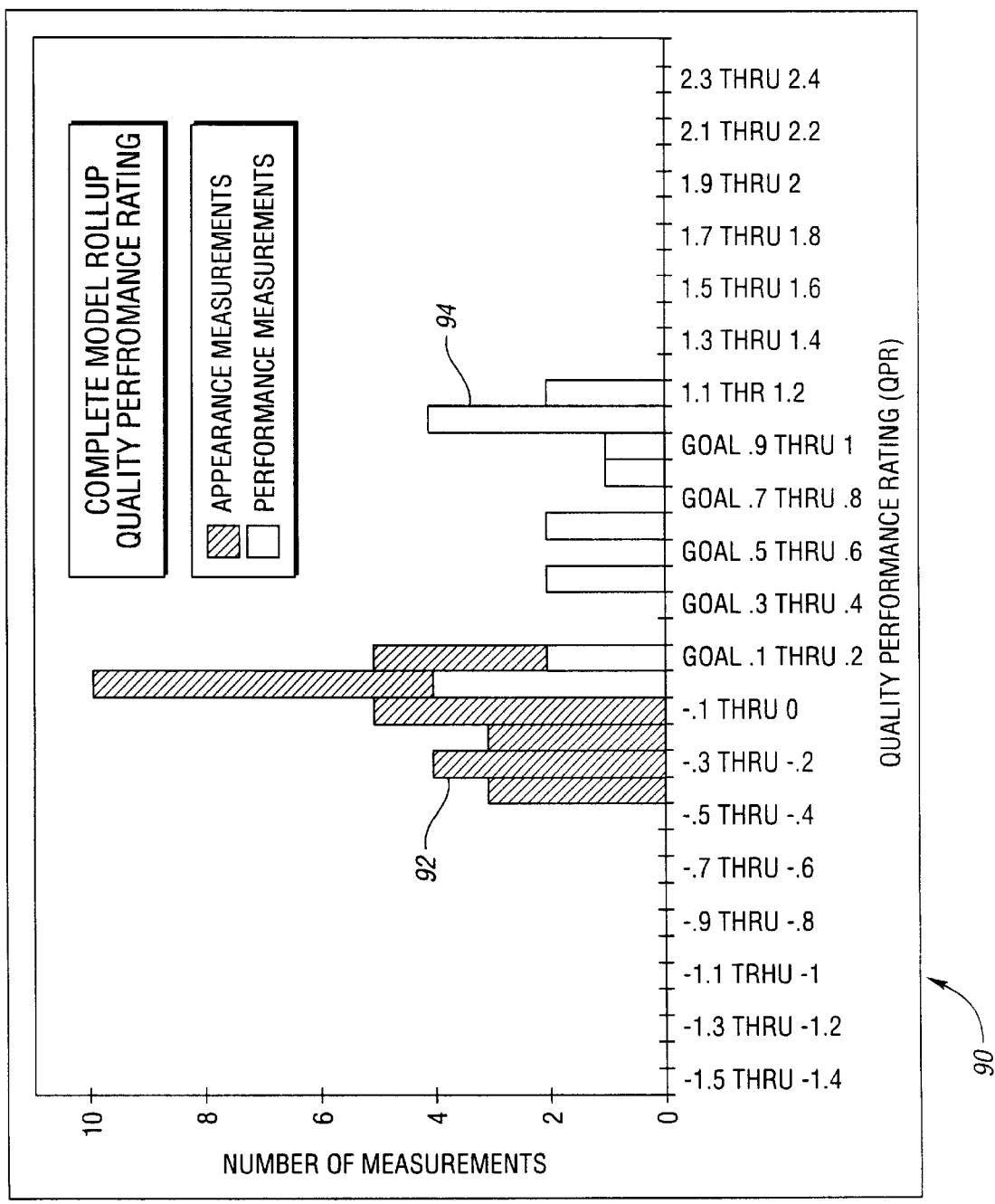
FIG. 4 is a chart depicting a complete model roll up of Quality Performance Rating, illustrating two different families according to one embodiment of the present invention.

Referring to FIG. 4, a chart, generally indicated at 90, depicts a complete model roll up of Quality Performance Rating, illustrating both the appearance family and the performance family of measurements. Bars 92 represent appearance measurements, while bars 94 represent performance measurements. Along the abscissa are different ranges for the Quality Performance Rating. The ordinate indicates a number of measurements within a particular Quality Performance Rating range. Chart 90 indicates that while some properties of the exemplary product are well above desired quality goals (ratings above one), other properties are in need of improvement (ratings below zero). A product demonstrating completely acceptable performance has all Quality Performance Rating values between zero and one. That is, all process capabilities are between the lower and upper quality limits resulting is the process capabilities mapping to the fixed quality factor range, which ranges from zero to one for the Quality Performance Rating.

Figure 5:
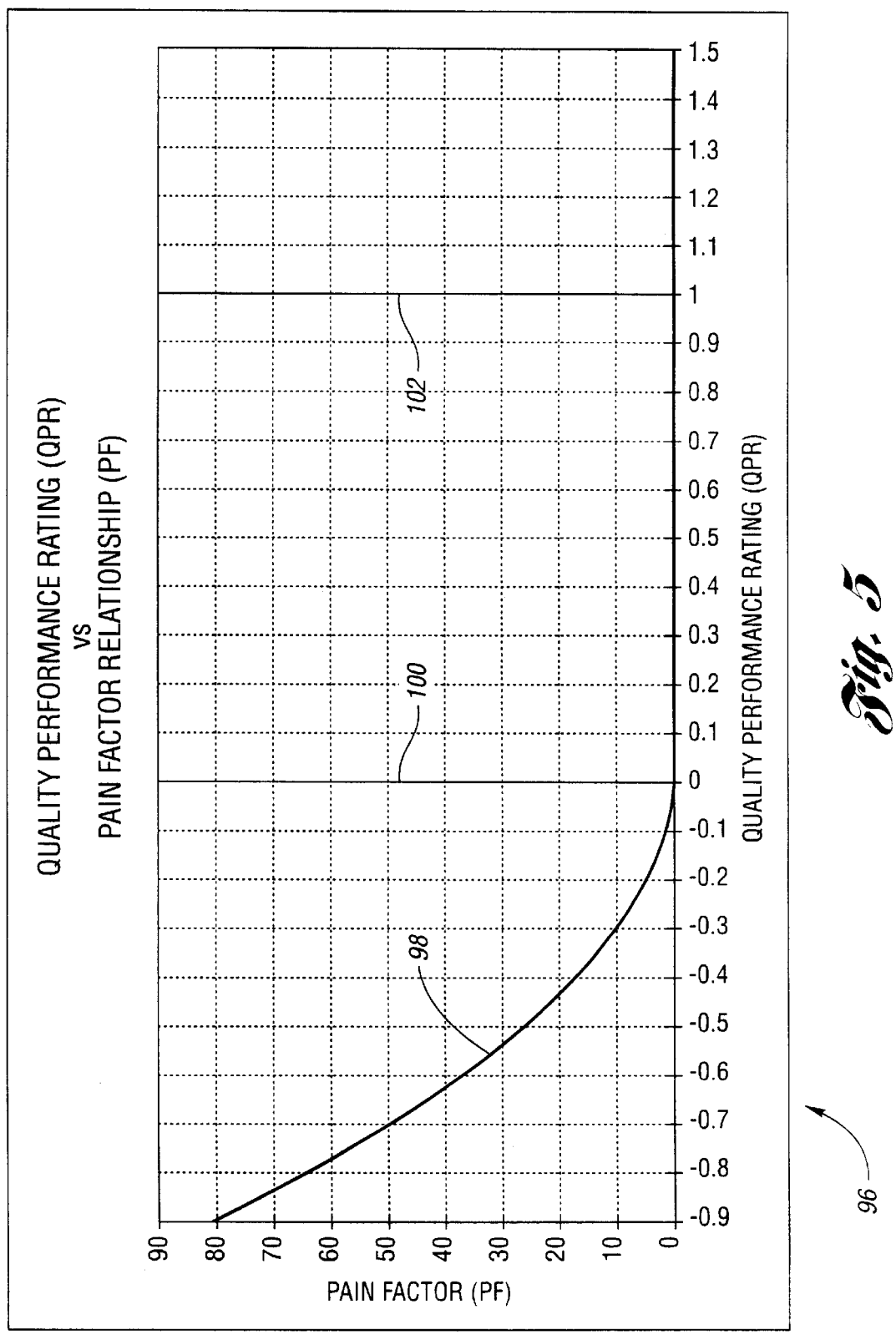
FIG. 5 is a graph depicting Quality Performance Rating versus Pain Factor according to one embodiment of the present invention.

With reference to FIG. 5, a graph depicts Quality Performance Rating versus Pain Factor, and is generally indicated at 96. Line 98 illustrates that the Pain Factor generally increases as a distance between the Quality Performance Rating and the lower quality limit line 100 increases, when the Quality Performance Rating is below the lower quality limit. In terms of process capability, the Pain Factor generally increases as a distance between the node process capability and the corresponding quality limit increases, when the process capability falls below the corresponding quality limits. Upper quality limit line 102 is illustrated for reference.

In a preferred embodiment, the Pain Factor is determined as follows:

$$PF=(QPR<0)*(10*QPR)^2$$

wherein PF is the Pain Factor, and QPR is the Quality Performance Rating. The logical expression returns a value of 1 when true, and returns a value of 0 when false. Of course, the Pain Factor may be determined many other ways in accordance with its definition given previously.

Figure 6:
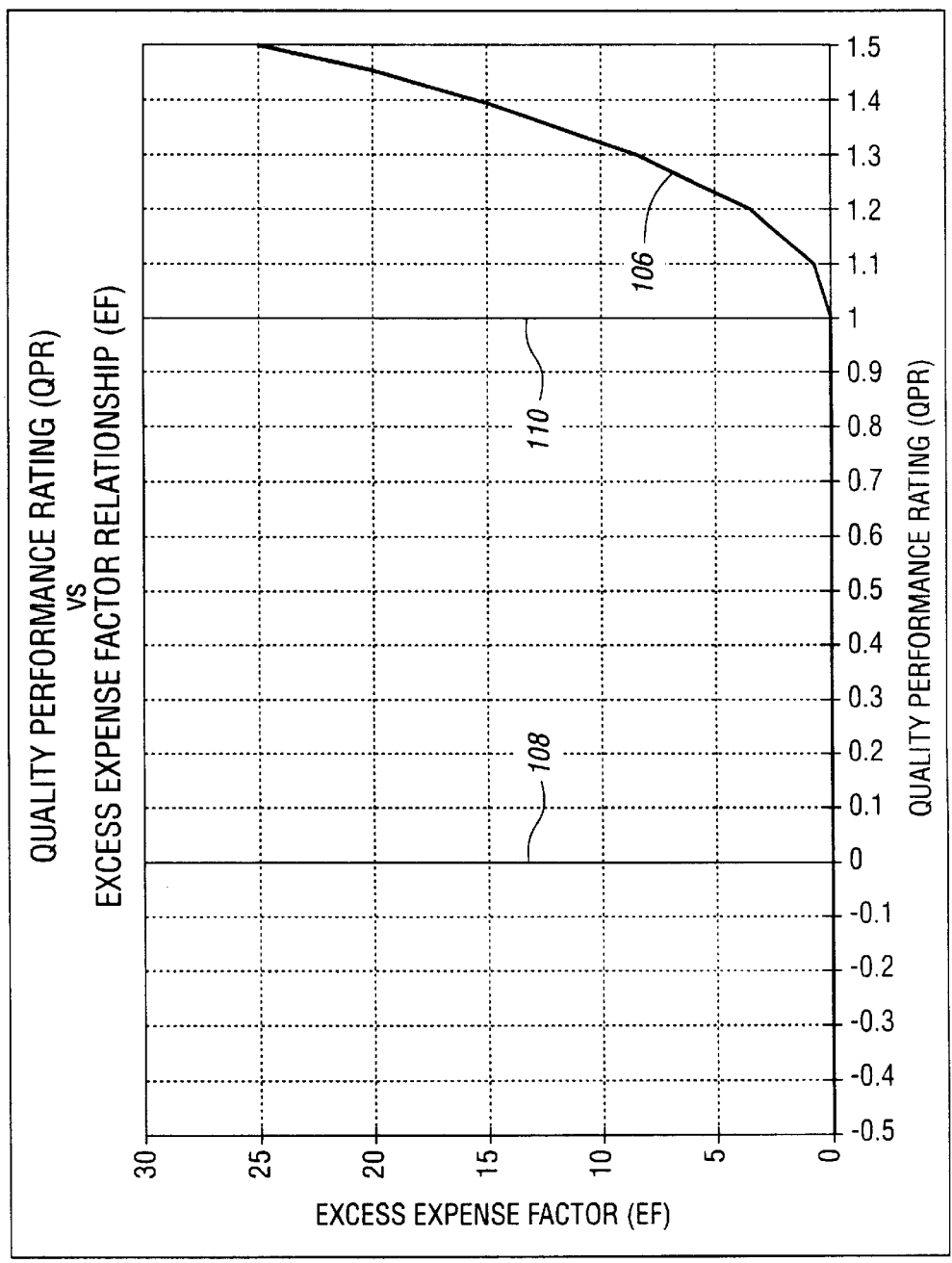
FIG. 6 is a graph depicting Quality Performance Rating versus Expense Factor according to one embodiment of the present invention.

Referring to FIG. 6, a graph depicts Quality Performance Rating versus Expense Factor, and is generally indicated at 104. Line 106 illustrates that the Expense Factor generally increases as the Quality Performance Rating increases beyond upper quality limit line 110. Lower quality line 108 is shown for reference. In terms of process capability, the Expense Factor generally increases as a distance between the node process capability and the corresponding quality limits increases, when the process capability falls above the corresponding quality limits.

In a preferred embodiment, the Expense Factor is determined as follows:

$$EF=(QPR>1)*(10*(QPR-1))^2$$

wherein EF is the Expense Factor, and QPR is the Quality Performance Rating. The logical expression returns a value of 1 when true, and returns a value of 0 when false. Of course, the Expense Factor may be determined many other ways in accordance with its definition given previously.

Figure 7:
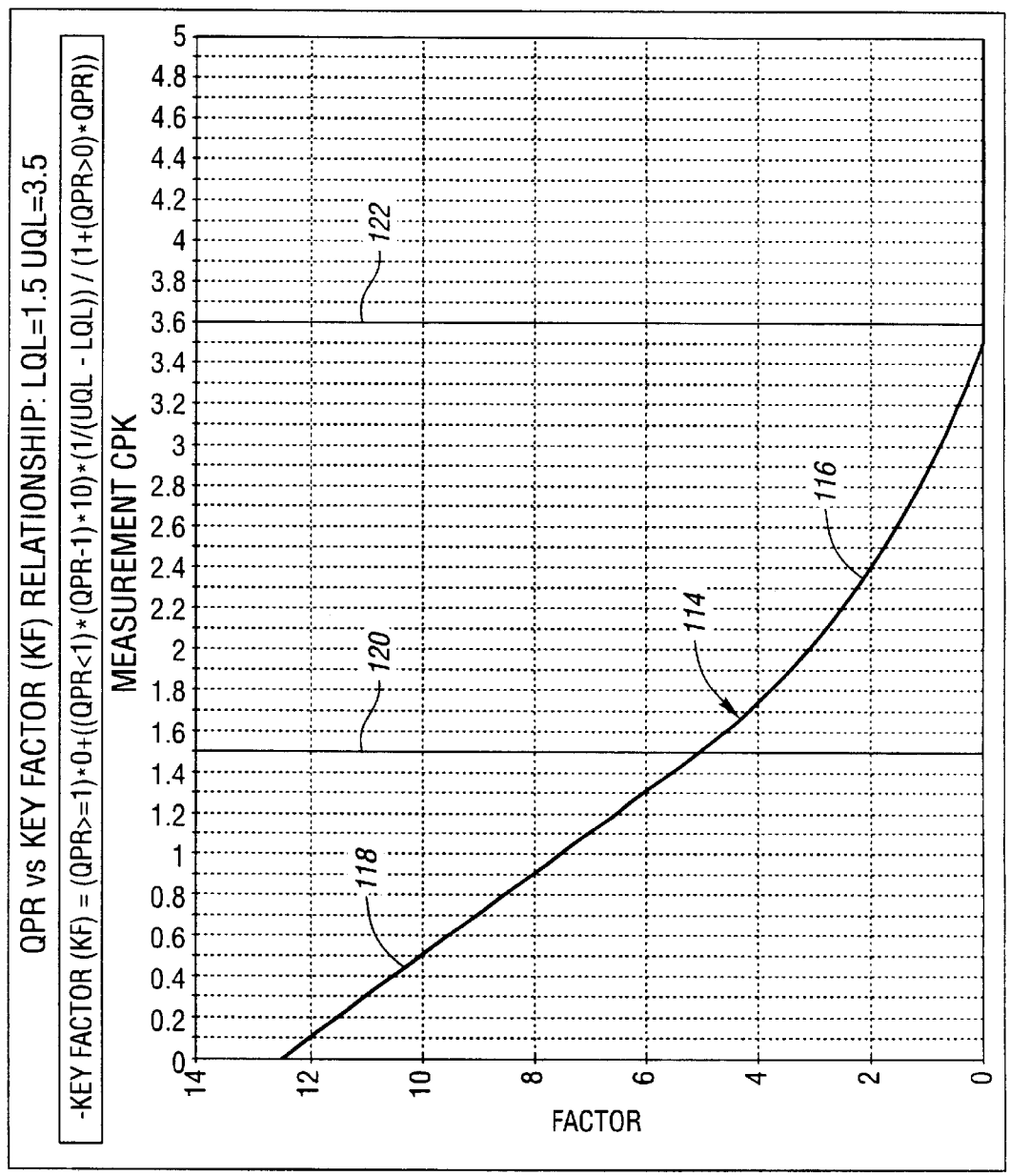
FIG. 7 is a graph depicting Quality Performance Rating versus Key Factor according to one embodiment of the present invention.

Referring to FIG. 7, a graph depicts Quality Performance Rating versus Key Factor, and is generally indicated at 112. Key Factor line 114 has right portion 116 and left portion 118. Right portion 116 is bounded by lower and upper quality limit lines 120 and 122, respectively. As depicted, the Key Factor generally increases when the process capability is within the quality limits, and increases when process capability falls below lower quality limit line 120. That is, Key Factor increases when the process capability falls below upper quality limit line 122. Preferably, the Key Factor is a function of the Quality Performance Rating and the size of the acceptable quality range for process capability. In a preferred embodiment, the Key Factor is determined according to the following equation:

$$KF=(QPR>=1)*0+((QPR<1)*(QPR-1)*10)*(1/(UQL-LQL))/(1+(QPR>0)*QPR))$$

wherein KF is the Key Factor, QPR is the Quality Performance Rating, UQL is the upper quality limit, and LQL is the lower quality limit. The logical expressions within the above equation return a value of 1 when true, and a value of 0 when false. Of course, the Key Factor may be determined many other ways in accordance with its definition given previously. Preferably, the Key Factor generally increases as the acceptable quality range diminishes.

In accordance with the present invention, performance ratings are determined based on contribution parameters and process capability, and preferably further based on performance factors. Preferably, the fractional or percentage of contribution for each of the contributors to the variation observed in a characteristic is found by performing a statistical tolerance analysis.

For each characteristic, an Individual Tolerance Contribution (IC) matrix, illustrated below for characteristic CharX, is generated from the statistical tolerance analysis or statistical performance data. The IC matrix is a single column matrix wherein each row represents the fractional (or percentage) contribution of a particular contributor to variation in the characteristic represented by that IC matrix. In an IC matrix, the sum of the values in the column is equal to one, or one hundred percent. That is, in a preferred embodiment, the contribution parameters for a node are the entries in the IC matrix for the characteristic that corresponds to that node. In such an implementation, nodes can share IC matrices when the nodes correspond to the same measurement.

|  | CharX |
| --- | --- |
| Contributor1 | $IC_1$ |
| * | * |
| * | * |
| * | * |
| ContributorN | $IC_N$ |

A Total Contribution (TC) Matrix is a matrix that has a column for each characteristic, and a row representing each contributor. That is, the entry in the TC matrix at row i, column j, is the fractional (or percentage) contribution of the i-th contributor to the j-th characteristic. More particularly, the TC matrix is formed by lumping all of the single column IC matrices into a single matrix where each column of the new TC matrix was one of the IC matrices. Of course, the contribution parameters may be represented in many different ways in accordance with the above description of the term "contribution parameter."

The TC matrix, illustrated below, makes all the contributions of all contributors to all characteristics available in a single matrix. The rows may be summed to find the total contribution that any one contributor provides to the variation in the set of characteristics to be studied. As stated above, TC matrix entry $TC_{xj}$ is equal to the CharX IC matrix entry $IC_j$.

|  | Char1 | * | * | * | CharM |
|---|---|---|---|---|---|
| Contributor1 | $TC_{11}$ | * | * | * | $TC_{1M}$ |
| * | * | * | * | * | * |
| * | * | * | * | * | * |
| * | * | * | * | * | * |
| ContributorN | $TC_{N1}$ | * | * | * | $TC_{NM}$ |

The simple fact that a characteristic has variation does not necessarily mean that the variation generated is an item of concern. A method of finding the relative pain, expense, and key associated with each of the contributors based on the overall performance of the characteristic relative to the quality limits was developed.

In the performance factors described previously, the factor of ten is included in the preferred calculation for some of the different performance factors, such as the Pain Factor, Expense Factor, and Key Factor, to prevent small decimal values for the Quality Performance Rating from diminishing the weighting effects of the performance factors. If this diminishing were allowed to happen in a realistic application, the performance factor values could become so small as to cause rounding or truncating errors which could be significant.

FIGS. 5–7 provide excellent visual indication of the performance factor weighting that occurs as process capability varies. The different performance factors each are configured to respond to different trends in process capability.

By utilizing the performance factors and the contribution parameters together, a weighting method allows "filtering out" of the contributors that contributed mainly to measurements which indicated acceptable performance while highlighting those which contributed to measurements which were showing poor performance. For example, Pain Factors, Expense Factors, and Key Factors may be utilized along with the Total Contribution Matrix (TC) to provide useful information about how each contributor truly contributes to a product.

The Pain Contribution Matrix (PCM) is calculated by multiplying each cell in the Total Contribution (TC) matrix by the Pain Factor (PF) for the characteristic corresponding to the particular column in the Total Contribution (TC) matrix:

$$PCM_{ij} = TC_{ij} * PF_j$$

wherein $PCM_{ij}$ is the i-th row, j-th column entry in the Pain Contribution Matrix, $TC_{ij}$ is the i-th row, j-th column entry in the Total Contribution Matrix, and $PF_j$ is the Pain Factor associated with the j-th Characteristic. Thus, the Pain Contribution Matrix weights the values in each column of the Total Contribution Matrix based on the Pain Factor associated with the characteristic represented by that column in the Total Contribution Matrix.

The Expense Contribution Matrix (ECM) is calculated by multiplying each cell in the Total Contribution (TC) matrix by the Expense Factor (EF) for the characteristic corresponding to the particular column in the Total Contribution (TC) matrix:

$$ECM_{ij} = TC_{ij} * EF_j$$

wherein $ECM_{ij}$ is the i-th row, j-th column entry in the Expense Contribution Matrix, $TC_{ij}$ is the i-th row, j-th column entry in the Total Contribution Matrix, and $EF_j$ is the Expense Factor associated with the j-th Characteristic. Thus, the Expense Contribution Matrix weights the values in each column of the Total Contribution Matrix based on the Expense Factor associated with the characteristic represented by that column in the Total Contribution Matrix.

The Key Contribution Matrix (KCM) is calculated by multiplying each cell in the Total Contribution (TC) matrix by the Key Factor (KF) for the characteristic corresponding to the particular column in the Total Contribution (TC) matrix:

$$KCM_{ij} = TC_{ij} * KF_j$$

wherein $KCM_{ij}$ is the i-th row, j-th column entry in the Key Contribution Matrix, $TC_{ij}$ is the i-th row, j-th column entry in the Total Contribution Matrix, and $KF_j$ is the Key Factor associated with the j-th Characteristic. Thus, the Key Contribution Matrix weights the values in each column of the Total Contribution Matrix based on the Key Factor associated with the characteristic represented by that column in the Total Contribution Matrix.

The Expense Contribution Matrix (ECM), however, does not always provide a robust method of forming a decision of which contributors to relax due to the fact that some risk contributors may also appear in the Key Contributor Matrix (ECM). If this condition is true, the probability would be that the contributor selected for relaxation would drive extremely poor quality performance on one or more other measurement (s). The Intersection between the two matrices may be removed from the Expense Contribution Matrix (ECM) to preclude this situation. A logical NOT is preferably performed on the Expense Contribution Matrix with the Key Contribution Matrix. That is, each cell in the True Expense Contribution Matrix (TECM) is the same as the Expense Contribution Matrix (ECM), when the corresponding Key Contributor Matrix (KCM entry is zero. Otherwise, the cell in the True Expense Contribution Matrix (TECM) contains a zero.

The above described performance ratings, more particularly, the values contained in the Pain Contribution Matrix (PCM), Expense Contribution Matrix (ECM), True Expense Contribution Matrix (TECM), and the Key Contribution Matrix (KCM), are exemplary performance ratings employed in a preferred embodiment of the present invention. Of course, other performance ratings are contemplated that are within the scope of the "performance rating" definition given previously.

Figure 8:
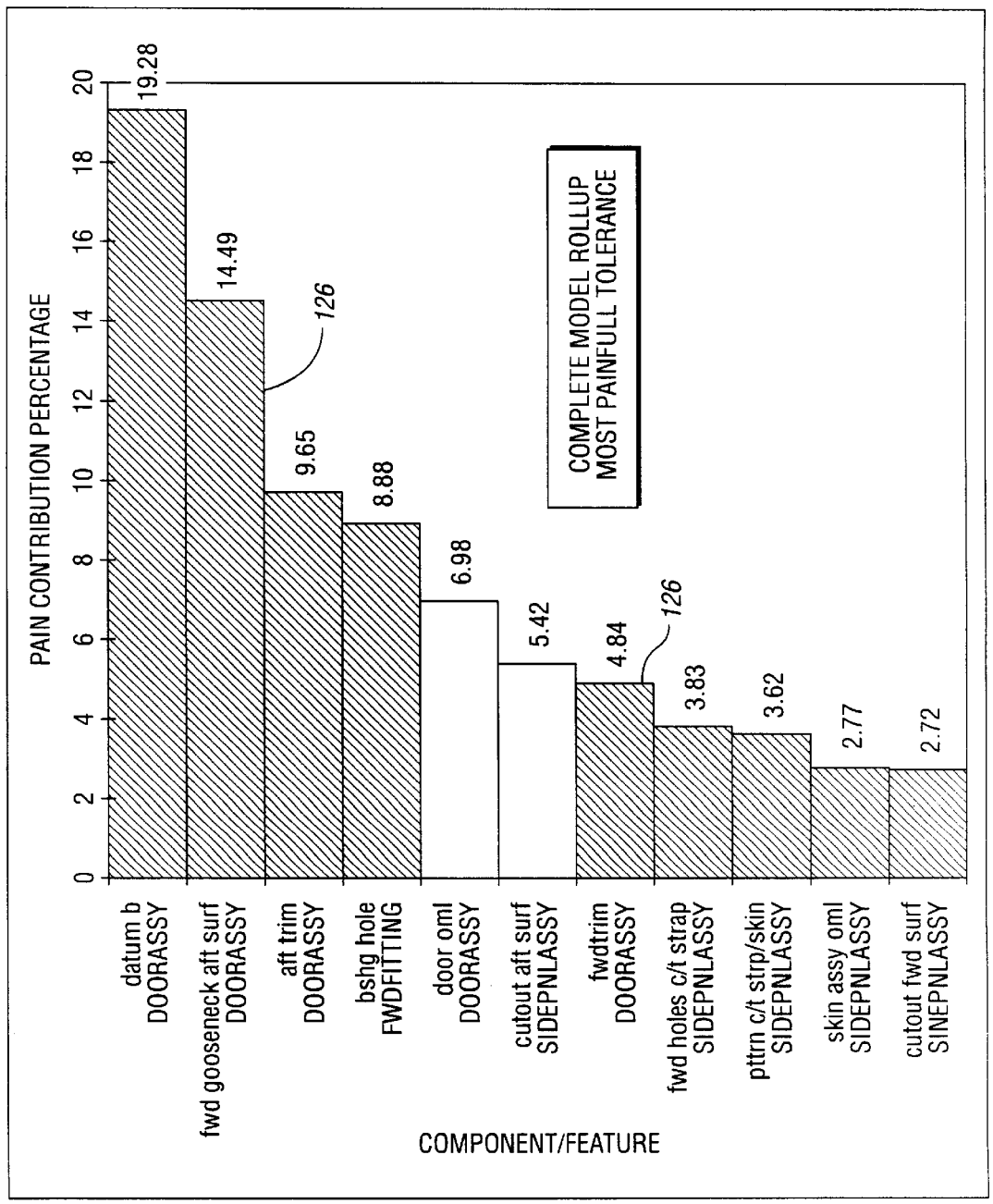
FIG. 8 is a chart depicting a complete model roll up of most painful tolerances, showing pain contribution percentages according to one embodiment of the present invention.

With reference to FIG. 8 the Pain Contribution Matrix (PCM) is converted to percentages, sorted into pareto order, and reported at 124. This provides excellent visibility to which contributors need to be constrained more tightly to achieve the desired quality goals. Pain Contribution Percentages are indicated as bars 126.

Figure 9:
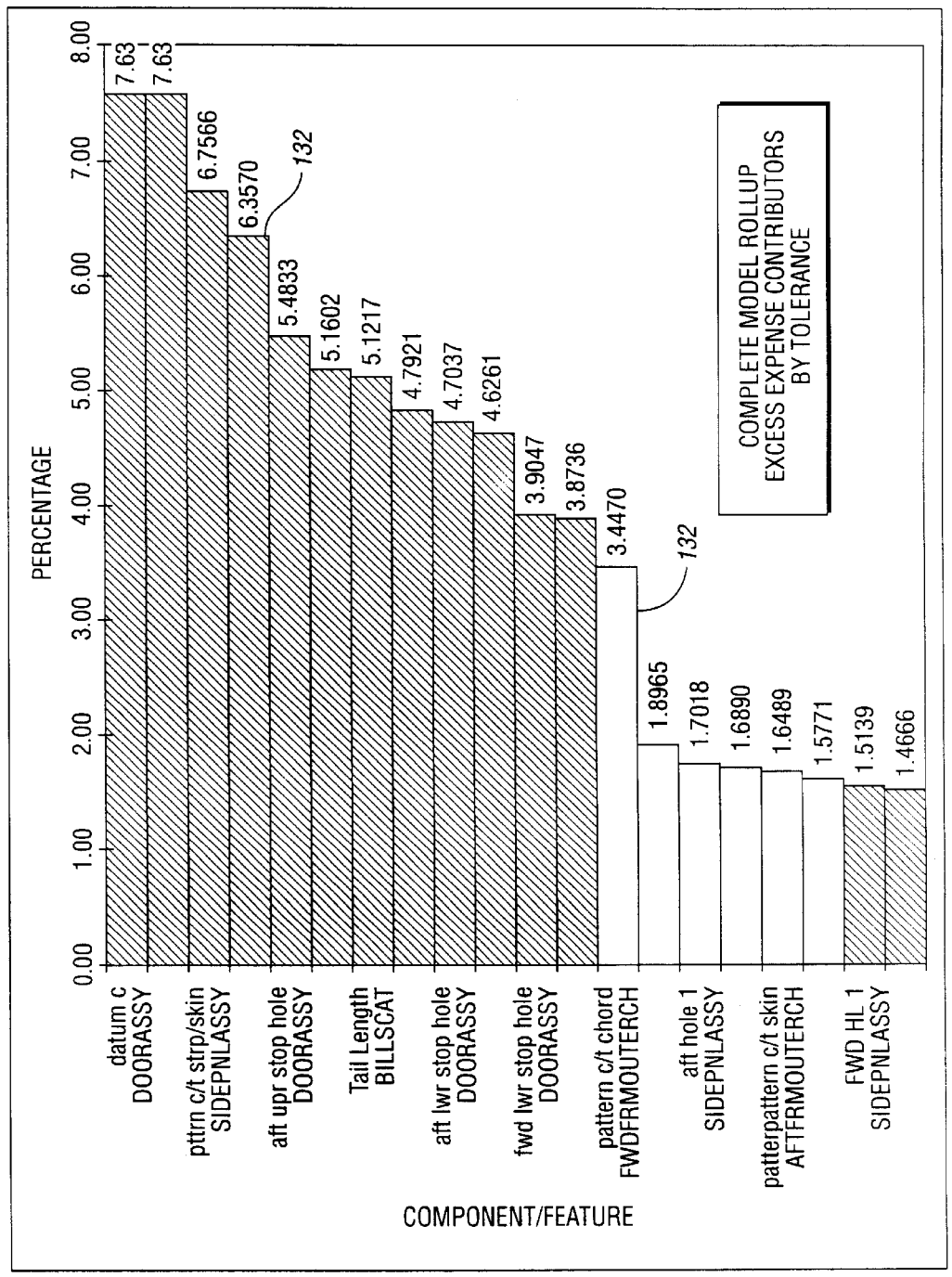
FIG. 9 is a chart depicting a complete model roll up of expense contributors by tolerance, showing expense contribution percentages according to one embodiment of the present invention.

With reference to FIG. 9, the True Expense Contribution Matrix (TECM) is converted to percentages, sorted into pareto order and reported at 130. This provides excellent visibility to which contributors could be relaxed without risking the quality performance of any other measurements. It should be noted that the items appearing at the top of the pareto chart will have the largest impact on the over-performing measurements while the contributors appearing at the bottom of the chart are likely to be the most expensive contributors to produce. Expense Contribution Percentages are indicated as bars 132.

Figure 10:
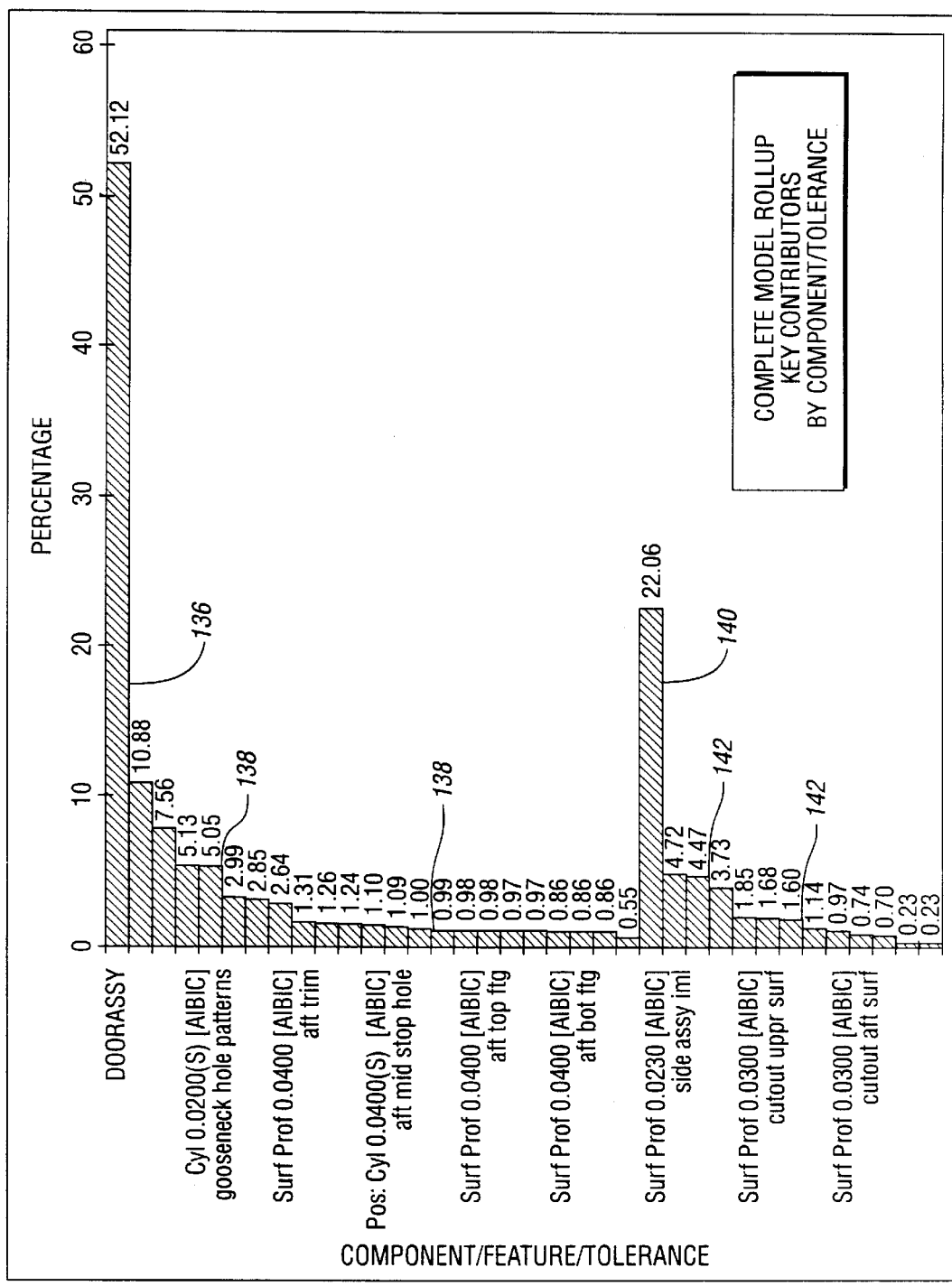
FIG. 10 is a chart depicting a complete model roll up of key contributors by component/tolerance, showing key contribution percentages according to one embodiment of the present invention.

With reference to FIG. 10, the Key Contributor Matrix (KCM) is converted to percentages, sorted into pareto order and reported. This provides excellent visibility to which contributors have the highest likelihood of detrimentally impacting product performance. It should be noted that the pareto is shown with the contributors sorted by highest contributing component first, then the particular tolerances within that component next. This chart can be extremely lengthy and has been abbreviated for this document. Key Contribution Percentages for a first component and its associated tolerances are indicated at bars 136 and 138, respectively. Key Contribution Percentages for a second component and its associated tolerances are indicated at bars 140 and 142, respectively.

Therefore, in essence, the Pain Contribution Matrix (PCM) and the True Expense Contribution Matrix (TECM) can be seen as opposites which force a controlled balance on the analysis. This causes the analysis to attempt to perform to ALL quality goals simultaneously while keeping expenses in check and accomplishes a set theory based solution to the complex intentions of the designer.

The overall effect of the Key Contribution function is to identify any and all key properties on detail parts or subassemblies which have the potential to degrade product performance, appearance, or longevity.

All of the bar charts, histograms, and pareto charts may be produced for each node in the measurement tree. This allows the connectivity of a problem with the product to be seen at the top level, down to the specific aspects of the detail part, tool, or assembly process.

A problem can be identified, in macro, at the top level. The root cause can then be identified by following the problem down the measurement tree to its source. The pain drivers appearing at that level in the tree are the cumulative cause of the problem.

Figure 11:
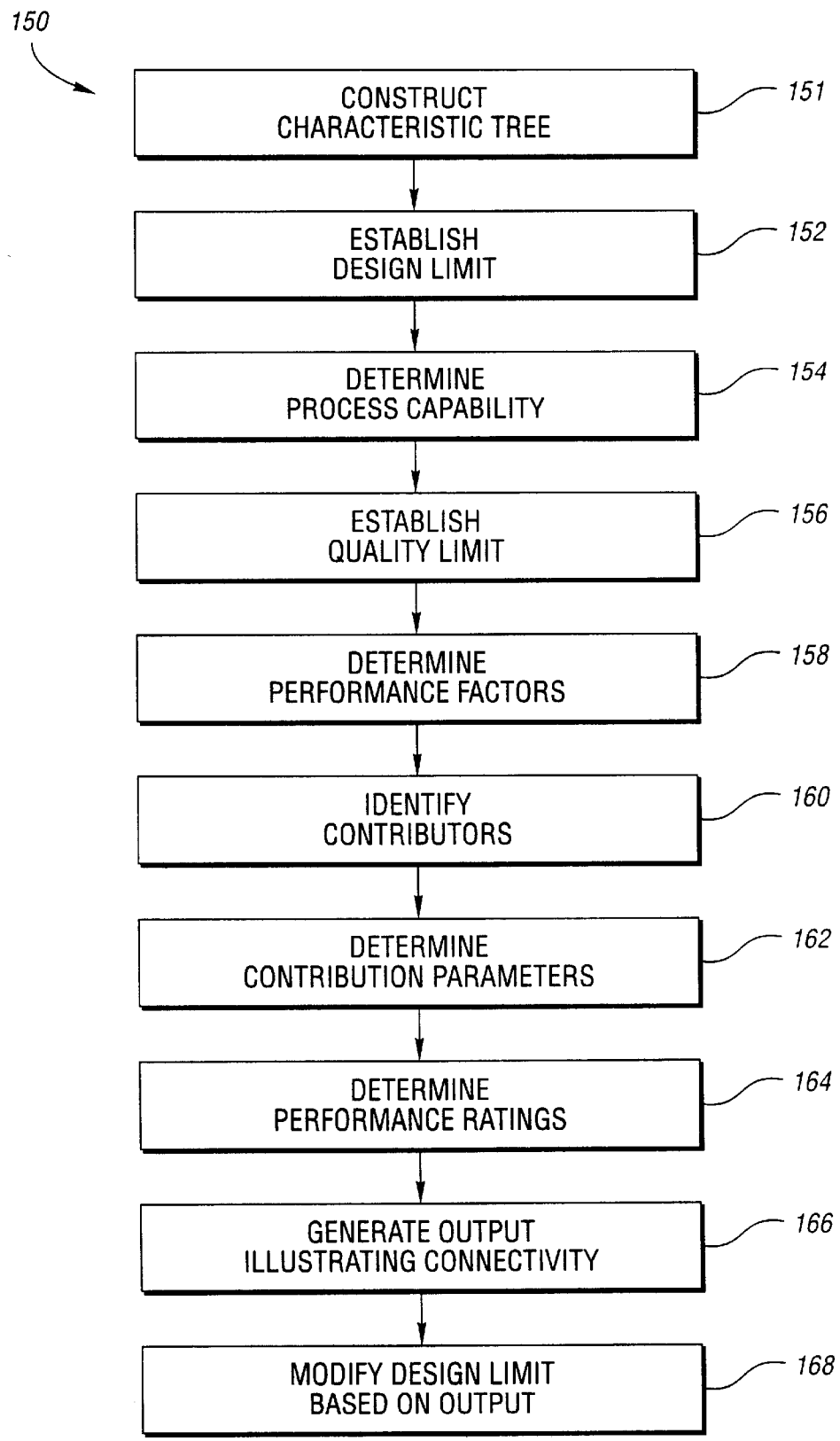
FIG. 11 is a block diagram illustrating a method of the present invention for optimizing assembly performance.

Referring to FIG. 11, a block diagram illustrating a method of the present invention for optimizing product component characteristics is generally indicated at 150. At block 151, a characteristic tree is constructed. At block 152, design limits are established for each node in the characteristic tree. At block 154, process capability is determined for each node. At block 156, quality limits are determined for each node. The quality limits define a range of acceptable process capabilities at each node such that the characteristic is acceptable at that node. At block 158, one or more performance factors are determined. Preferably, the performance factors include a quality factor such as the Quality Performance Rating, a Pain Factor, an Expense Factor, and a Key Factor.

At block 160, the contributors that cause variation in the characteristics are identified. At 162, the contribution parameters for each node are determined. At block 164, performance ratings are determined for each node. The performance ratings are based on the process capability and/or performance factors, and are further based on the contribution parameters for each node. At block 166, an output is generated that illustrates the connectivity among different performance areas for the product.

Referring to FIG. 12, a computer system is generally indicated at 190. Computer system 190 includes desktop case 192, monitor 194, and keyboard 196. Floppy disk drive 198 and CD-ROM drive 200 allow computer 190 to read information stored on a floppy disk 202 or a compact disk 204. Of course, computer 190 may be configured to read many other types of computer-readable storage media, including but not limited to, a hard drive, a network drive, any known forms of software, firmware, or hardware.

Information stored on a computer-readable storage medium or media represents instructions executable by computer 190 to optimize characteristics for a product. The instructions stored on the computer-readable storage medium include instructions for constructing a measurement tree, instructions for establishing design limits, instructions for determining process capability, instructions for identifying contributors, and instructions for determining contribution parameters. The computer readable storage medium further includes instructions for determining performance ratings for each node, and instructions for generating an output based on the performance ratings and the characteristic tree to illustrate to a user the connectivity among different performance areas for the product. The output may be generated on, for example, monitor 174 or printer 186.

The instructions may be arranged in a variety of ways, such as in a spread sheet or a stand-alone executable file. For example, MICROSOFT EXCEL may be employed to execute instructions (cell definitions) to perform embodiments of the present invention, or VISUAL BASIC may be employed to make an executable file to implement embodiments of the present invention.

It is to be appreciated that in accordance with the present invention, design limits, process capability, quality limits, contributors, and contribution parameters may be established or determined in a number of ways. The terms "establishing" and "determining" as used herein are meant to broadly encompass a variety of different techniques for gathering the needed data. Further, the terms "establishing" and "determining" are meant to encompass analytical calculation, as well as values gathered from real testing. Exemplary data sources include: measured product data from Statistical Process Controls and Design of Experiments, Manual Statistical Tolerance Analysis Methods, Computer Based Statistical Tolerance Analysis Methods including: Valisys Assembly, Valisys; CATVSA Variation Systems Analysis; DCS-3D Dimensional Control Systems; Ti-TOL 3D, Texas Instruments, and many others.

Further the terms "establishing", "determining", and other similar words such as "inputting" if appropriate as used here in are meant to encompass establishing and/or determining and/or inputting values by reading data. For example, values may be stored on a computer readable storage medium and subsequently those values may be read by a computer to establish, determine, and/or input design limits, process capability, quality limits, contributors, and/or contribution parameters. Further, values may be established or determined or inputted by manually entering the values at a terminal, when the values are gathered in a written report. Still further, values may be established and/or determined by the computer according to appropriate instructions, if desired and appropriate for the particular application of the invention.

It is to be appreciated that embodiments of the present invention may be used in other areas that demand quality control, in addition n to manufacturing. It is also to be appreciated that the data and conclusions obtained from analysis in accordance with the present invention may be used to: verify that the definition of a product is valid and effective, verify that the manufacturing process being used is performing as desired, identify areas in the manufacturing process that would be good candidates for improvement, identify processes and methods which are causing downstream difficulty in production, identify and correct root causes for recurring defects, identify key elements which should be measured during the manufacturing sequence, and identify components which actually perform too well and may be degraded to avoid unnecessary costs.

While the invention has been described in detail, those familiar with the art to which this invention relates will recognize various alternative designs and embodiments for practicing the invention as defined by the following claims.

What is claimed is:

1. A computer based method for optimizing performance of a product having components defining a plurality of characteristics, the method comprising:

constructing a characteristic tree with branches corresponding to performance areas and nodes corresponding to characteristics;

inputting a design limit for each node;

determining a process capability for each node based on the design limit for that node;

determining a performance factor for each node based on the process capability for that node;

inputting a contribution parameter for each node, each contribution parameter for each node representing the contribution of a contributor to the variation in the characteristic corresponding to that node;

determining a performance rating for each node, wherein the performance rating is based on the performance factor and the contribution parameter for that node; and generating an output based on the performance rating and the characteristic tree to illustrate the connectivity among the performance areas of the product.

2. The method of claim 1 wherein determining the performance factor comprises:

inputting a quality limit for each node; and determining a quality factor for each node such that the quality factor falls in a fixed range when the node process capability meets the corresponding quality limit, the quality factor generally increases from the fixed range when the node process capability falls above the corresponding quality limit, and the quality factor generally decreases from the fixed range when the node process capability falls below the corresponding quality limit.

3. The method of claim 2 wherein determining the performance factor comprises:

determining a pain factor for each node such that the pain factor generally increases as a distance between the node process capability and the corresponding quality limit increases, when the process capability falls below the corresponding quality limit.

4. The method of claim 3 wherein the pain factor is determined according to:

$$PF=(QPR<0)*(10*QPR)^2$$

wherein PF is the pain factor, and QPR is the quality factor, when the process capability falls below the corresponding quality limit.

5. The method of claim 2 wherein determining the performance factor comprises:

determining an expense factor for each node such that the expense factor generally increases as a distance between the node process capability and the corresponding quality limits increase, when the process capability falls above the corresponding quality limits.

6. The method of claim 5 wherein the expense factor is determined according to:

$$EF=(QPR>1)*(10*(QPR-1))^2$$

wherein EF is the expense factor, and QPR is the quality factor, when the process capability falls above the corresponding quality limit.

7. The method of claim 2 wherein determining the performance factor comprises:

determining a key factor for each node such that the key factor generally increases as a distance between the node process capability and an upper limit of the quality limit criteria increases, when the process capability falls below the upper limit.

8. The method of claim 7 wherein the key factor is determined according to:

$$KF=(QPR>=1)*0+((QPR<1)*(QPR-1)*10)*(1/(UQL-LQL))/(1+(QPR>0)*QPR))$$

wherein KF is the Key Factor, QPR is the quality factor, UQL is the upper quality limit, and LQL is a lower quality limit.

9. The method of claim 1 further comprising:

modifying the design limit based on the output to optimize product performance.

10. A product having components defining a plurality of characteristics, the product being made in accordance with the method of claim 1.

11. The product of claim 10 wherein the product comprises at least one aerospace component.

12. A product for optimizing performance of a device having components defining a plurality of characteristics, the product comprising:

a storage medium; and computer readable instructions recorded on the storage medium, the instructions operative to:

construct a characteristic tree with branches corresponding to performance areas and nodes corresponding to characteristics;

establish a design limit for each node;

determine a process capability for each node based on the design limit for that node;

determine a performance factor for each node based on the process capability for that node;

establish a contribution parameter for each node, each contribution parameter for each node representing the contribution of a contributor to the variation in the characteristic corresponding to that node;

determine a performance rating for each node, wherein the performance rating is based on the performance factor and the contribution parameter for that node; and generate an output based on the performance rating and the characteristic tree to illustrate the connectivity among the performance areas of the product.

13. The product of claim 12 wherein the instructions operative to determine the performance factor are further operative to:

establish a quality limit for each node; and determine a quality factor for each node such that the quality factor falls in a fixed range when the node process capability meets the corresponding quality limit, the quality factor generally increases from the fixed range when the node process capability falls above the corresponding quality limit, and the quality factor generally decreases from the fixed range when the node process capability falls below the corresponding quality limit.

14. The product of claim 13 wherein the instructions operative to determine the performance factor are further operative to:

determine a pain factor for each node such that the pain factor generally increases as a distance between the node process capability and the corresponding quality limit increases, when the process capability falls below the corresponding quality limit.

15. The product of claim 14 wherein the pain factor is determined according to:

$$PF=(QPR<0)*(10*QPR)^2$$

wherein PF is the pain factor, and QPR is the quality factor, when the process capability falls below the corresponding quality limit.

16. The product of claim 13 wherein the instructions operative to determine the performance factor are further operative to:

determine an expense factor for each node such that the expense factor generally increases as a distance between the node process capability and the corresponding quality limits increase, when the process capability falls above the corresponding quality limits.

17. The product of claim 16 wherein the expense factor is determined according to:

$$EF=(QPR>1)*(10*(QPR-1))^2$$

wherein EF is the expense factor, QPR is the quality factor, when the process capability falls above the corresponding quality limit.

18. The product of claim 13 wherein the instructions operative to determine the performance factor are further operative to:

determine a key factor for each node such that the key factor generally increases as a distance between the node process capability and an upper limit of the quality limit criteria increases, when the process capability falls below the upper limit.

19. The product of claim 18 wherein the key factor is determined according to:

$$KF=(QPR>=1)*0+((QPR<1)*(QPR-1)*10)*(1/(UQL-LQL))/(1+(QPR>0)*QPR))$$

wherein KF is the Key Factor, QPR is the quality factor, UQL is the upper quality limit, and LQL is a lower quality limit.

20. The product of claim 12 wherein the instructions are further operative to:

modify the design limit based on the output to optimize product performance.

* * * * *

UNITED STATES PATENT AND TRADEMARK OFFICE
CERTIFICATE OF CORRECTION

PATENT NO. : 6,243,614 B1
DATED : June 5, 2001
INVENTOR(S) : David S. Anderson

Page 1 of 1

It is certified that error appears in the above-identified patent and that said Letters Patent is hereby corrected as shown below:

<u>Title page,</u>
Should read -- A COMPUTER BASED METHOD AND PRODUCT FOR OPTIMIZING PERFORMANCE OF AN ASSEMBLY HAVING COMPONENTS DEFINING A PLURALITY OF CHARACTERISTICS --.

Signed and Sealed this

Eleventh Day of December, 2001

Attest:

*Nicholas P. Godici*

NICHOLAS P. GODICI
*Attesting Officer*    *Acting Director of the United States Patent and Trademark Office*